United States Patent
Bansemir et al.

[11] Patent Number: 6,162,313
[45] Date of Patent: Dec. 19, 2000

[54] METHOD FOR PRODUCING A COMPOSITE STRUCTURE INCLUDING A PIEZOELECTRIC ELEMENT

[75] Inventors: Horst Bansemir, Munich; Stefan Emmerling, Neubiberg, both of Germany

[73] Assignee: Eurocopter Deutschland GmbH, Munich, Germany

[21] Appl. No.: 09/120,588

[22] Filed: Jul. 22, 1998

[30] Foreign Application Priority Data

Jul. 29, 1997 [DE] Germany ............... 197 32 513

[51] Int. Cl.$^7$ ..................................... B32B 31/16
[52] U.S. Cl. .................. 156/163; 156/229; 310/325; 310/368
[58] Field of Search ..................... 156/160, 229, 156/161, 163, 221, 222, 223; 264/229; 310/325, 345, 368, 358; 29/25.35; 427/100

[56] References Cited

U.S. PATENT DOCUMENTS

| | | | |
|---|---|---|---|
| 2,756,353 | 7/1956 | Samsel | 310/8 |
| 3,817,806 | 6/1974 | Anderson et al. | 156/161 |
| 4,849,668 | 7/1989 | Crawley et al. | 310/328 |
| 4,922,096 | 5/1990 | Brennan . | |
| 5,305,507 | 4/1994 | Dvorsky et al. | 29/25.35 |
| 5,429,693 | 7/1995 | Rose | 156/161 |
| 5,632,841 | 5/1997 | Hellbaum et al. . | |
| 5,849,125 | 12/1998 | Clark | 156/222 |

FOREIGN PATENT DOCUMENTS 4025618 2/1992 Germany .

OTHER PUBLICATIONS

Journal: "Industrieanzeiger" 48–49, 1995; Article entitled: "Die Schwingungen sind gleich Null"; pp. 38 to 40.

Primary Examiner—Michael W. Ball
Assistant Examiner—Gladys Piazza
Attorney, Agent, or Firm—W. F. Fasse; W. G. Fasse

[57] ABSTRACT

A composite structure (3) includes a piezoelectric element (1) sandwiched between fiber composite panels (2). The composite structure can be used as an actuator element. In a method for producing the composite structure, the fiber composite panels are pre-stressed and pre-strained by applying respective pre-stressing forces ($F_1$, $F_2$) in opposite directions along two substantially perpendicular axes in the plane of the panel. The pre-stressed and pre-strained condition of the fiber composite panels (2) is maintained, while the panels are adhesively bonded (5) surfacially onto the piezoelectric element (1). After the bonding is completed, the pre-stressing forces are removed from the fiber composite panels. As a result, in the finished composite structure (3), the fiber composite panels (2) are under internal tension, while the piezoelectric element (1) is under internal compression. The pre-stressing forces ($F_1$, $F_2$) are particularly selected in magnitude and direction to achieve the required resultant balance of tension and compression within the composite structure (3). The pre-compression of the piezoelectric element (1) should be sufficient so that operating loads on the composite structure do not result in tension loading of the piezoceramic element, while substantially maintaining the useful active strain range of the overall composite structure.

27 Claims, 2 Drawing Sheets

METHOD FOR PRODUCING A COMPOSITE STRUCTURE INCLUDING A PIEZOELECTRIC ELEMENT

PRIORITY CLAIM

This application is based on and claims the priority under 35 U.S.C. §119 of German Patent Application 197 32 513.0, filed on Jul. 29, 1997. The entire disclosure of German Patent Application 197 32 513.0 is incorporated herein by reference.

FIELD OF THE INVENTION

The invention relates to a method for producing a composite structure of actuators, including a planar or plate-shaped piezo-electric element and fiber composite panels arranged on the two opposite major surfaces thereof.

BACKGROUND INFORMATION

It is generally known to manufacture composite structures of planar or plate-shaped panels with a planar or plate-shaped piezoceramic element arranged or sandwiched therebetween. Such composite structures are increasingly being used as components for high velocity actuators, for example such actuators to be used for active noise damping. There is also a hope to develop such composite structures for actuating or controlling the rotors of helicopters.

The known plate-shaped piezoceramic elements that are typically used in such applications, i.e. in high velocity actuators, have a high tension stiffness and compression stiffness, as well as a high compression strength, but a relatively low tensile strength and relatively low achievable active strain. These disadvantages of the known piezoceramic elements make it impossible to successfully use such piezoceramic elements in composite structures for controlling or actuating the rotors of helicopters. Namely, the rotors are subject to substantial tensile strain due to the centrifugal force arising during operation of the rotor, as well as tensile strains resulting from the bending moments. The known piezoceramic elements used in known composite structures are not able to withstand such substantial tensile strains, and thus cannot be used for actuating or controlling the helicopter rotors.

SUMMARY OF THE INVENTION

In view of the above, it is an object of the invention to provide a method for producing or manufacturing a composite structure that is suitable for controlling or actuating the rotors of helicopters, or generally for forming a motive element of an actuator, in which on the one hand the useable active strain is not substantially reduced, while on the other hand a tensile loading of the composite structure will not result in a tensile loading of the piezoceramic element itself. More directly, it is an aim of the invention to provide a method of manufacturing a composite structure including a piezoceramic element in combination with fiber composite panel layers, wherein the piezoceramic element is under compression while the fiber composite panels are under tension in a neutral or resting state of the composite structure. The invention further aims to overcome or avoid the disadvantages of the prior art, and to achieve additional advantages, as apparent from the present description.

The above objects have been achieved in a method for producing a composite structure including a planar or plate-shaped piezoelectric element sandwiched between two fiber composite panels, according to the invention. In the method, the fiber composite panels are each first subjected to a pre-stressing force effective in the plane of the respective panel. In this manner, each fiber composite panel is pre-stressed and preferably pre-strained or elongated, and then held in this condition. The pre-stressing forces can be applied by any known force-applying or straining means, for example by engaging the edges of the panels and applying mechanical loads thereto, or by other effects.

Next, the pre-stressed fiber composite panels are adhesively bonded onto the piezoelectric element over the entire contact surface therebetween, such that the piezoelectric element is securely and firmly sandwiched and embedded between the panels. Only after the adhesive bonding has been completed, e.g. the adhesive has cured, the pre-stressing forces are removed or released from the pre-stressed fiber composite panels. As a result, once the pre-stressing forces are removed, the fiber composite panels have a tendency to contract or shrink back to their respective un-stressed and un-strained resting condition, whereby the fiber composite panels are placed under internal tension, while the piezoelectric element bonded thereto is placed under internal compression.

Particularly according to the invention, the pre-stressing forces applied to the fiber composite panels are specifically selected and controlled in magnitude and direction, dependent on the specific parameters of the composite structure and the application at hand. Namely, the magnitude and direction of application of the pre-stressing forces is so selected, that the composite structure will withstand the passive tensile strains, and the tensile loads acting thereon in its intended application, without overcoming the pre-compression of the piezoelectric element and thereby subjecting the piezoelectric element to tension loads. Moreover, the pre-stressing forces must be limited to avoid over-compressing the piezoelectric element beyond its limits, or unnecessarily limiting the range of useable active strain of the finished composite structure. The proper application of the pre-stressing forces can also take into account the isotropy or anisotropy of the respective fiber composite panel.

By applying the pre-stressing with a targeted or custom-tailored magnitude and direction, the resulting composite structure can be optimized in such a manner that the passive tensile strains effective on the piezoceramic element are selected to be of such a magnitude that the piezoceramic element just withstands these passive tensile strains. In this manner, the range of useable active strain is maximized. The present method is particularly suitable for producing composite structures for controlling or actuating the rotors of helicopters. In this field of application, the exact selection of the magnitude and direction of the pre-stressing is especially advantageous, in view of the high tensile forces and corresponding high stresses that arise during operation.

BRIEF DESCRIPTION OF THE DRAWINGS

In order that the invention may be clearly understood, it will now be described in connection with an example embodiment, with reference to the drawings, wherein.

DETAILED DESCRIPTION OF PREFERRED EXAMPLE EMBODIMENTS AND OF THE BEST MODE OF THE INVENTION

Figure 1:
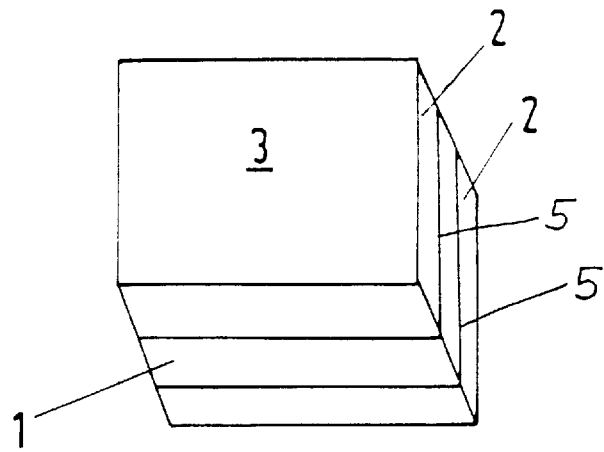
FIG. 1 is a schematic perspective view of a composite structure produced according to a method of the invention.

FIG. 1 schematically shows a composite structure 3 comprising a plate-shaped piezoceramic element 1 sandwiched between two fiber composite panels 2. Namely, the two fiber composite panels 2 are surfacially glued or adhesively bonded onto the two opposite flat faces of the piezoelectric element 1 using an adhesive 5. However, before the piezoceramic element 1 is adhesively bonded onto the two fiber composite panels 2, both of these fiber composite panels 2 are subjected to a pre-stressing force as represented schematically in FIG. 2.

Figure 2:
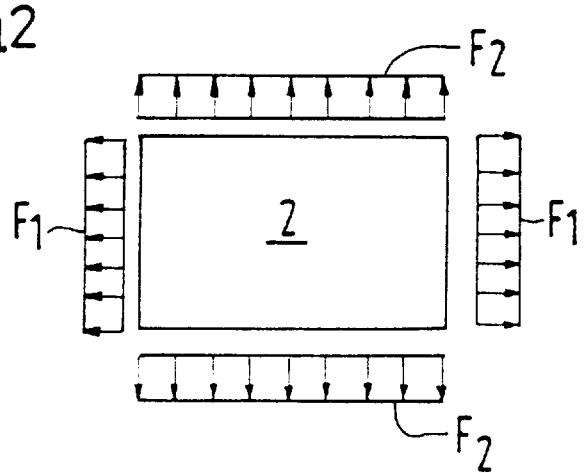
FIG. 2 is a schematic plan view of one of the fiber composite panels of the composite structure, with respective arrows schematically representing the pre-stressing forces applied to the panel.

In this context, with reference to FIG. 2, each fiber composite panel 2 has a mechanically effective force applied thereto in opposite directions along two substantially perpendicular force axes in the plane of the panel as represented by the force arrows $F_1$ and $F_2$. The magnitude of the pre-stressing force is respectively tuned or custom tailored, depending on the strength characteristics of the respective fiber composite panel 2 and of the piezoceramic element 1 to which it is to be bonded, as will be discussed in detail below. The pre-stressing forces $F_1$ and $F_2$ may, for example, be applied to the fiber composite panel 2 by grasping or otherwise engaging the respective edges of the panel 2 with clamping jaws of any suitable tensile force or strain application machine, or any other known manner. As an alternative to applying forces along two substantially perpendicular axes, if it is so desired for a particular application, it is possible to pre-stress the fiber composite panel 2 along only one force axis, for example applying only the force $F_1$ or only the force $F_2$.

As a result of the application of the pre-stressing forces $F_1$ and $F_2$, each composite panel is placed and held under an internal tension along the direction or axis of the pre-stressing force. Typically, and preferably, the fiber composite panel 2 will thereby also undergo elastic strain and elongation along the direction or axis of the pre-stressing force. Each pre-stressed fiber composite panel 2 is then held in this pre-stressed and pre-strained state, and is adhesively bonded onto an intervening piezoceramic element 1 using an adhesive 5 applied over the entire contact surface or interface, as shown schematically in FIG. 3. When carrying out the bonding, the piezoceramic element 1 is under a neutral or unstressed condition, while the fiber composite panels 2 are held in their pre-stressed and pre-strained condition. To carry out the bonding, a pressing force q is applied perpendicularly onto the respective outer fiber composite panels 2. The details of the bonding are generally conventional, and are appropriate for the particular type of adhesive 5, for example involving curing in a vacuum oven or the like.

Once the bond is completed, the pressing force q, and also the pre-stressing forces $F_1$ and $F_2$ are removed from the fiber composite panels 2, i.e. the panels are released from the respective force-applying equipment. As a result, the internal tension and elastic elongation of the fiber composite panels 2 has a tendency to contract the fiber composite panels 2 in a direction along the axis or axes of the applied pre-stressing force or forces $F_1$, $F_2$. However, the adhesive 5 securely bonds the fiber composite panels 2 to the piezoceramic element 1, such that the contracting tendency of the fiber composite panels 2 applies a compressive stress to the piezoceramic element 1 along the direction or axis of the originally applied pre-stressing force or forces in the fiber composite panels 2.

Figure 3:
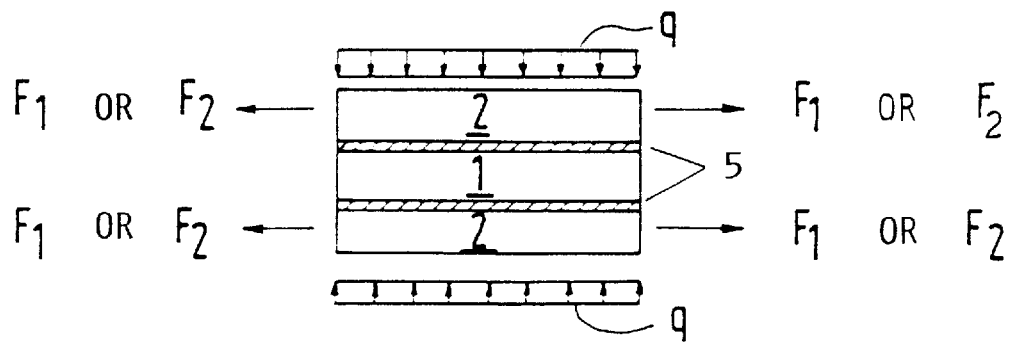
FIG. 3 is a schematic vertical section through a composite structure, during its manufacturing according to the method of the invention.

While FIG. 3 schematically shows two fiber composite panels 2 with a single piezoceramic element 1 sandwiched therebetween, it is also possible to build up a laminated stack of a greater number of fiber composite panels 2 and a greater number of piezoceramic elements 1 alternating with one another.

As a result of the above described fabrication process, the finished composite structure 3 as shown in FIG. 1 has the fiber composite panels 2 under an internal state of tension, while the piezoceramic element 1 is under an internal state of compression, along each respective axis of the initially applied pre-stressing force. The original pre-stressing forces $F_1$ and $F_2$ applied during the fabrication process must be exactly selected to properly balance the tension in the fiber composite panels 2 and the compression in the piezoceramic element 1. Namely, the compressive strength limit of the piezoceramic element 1 must not be exceeded, the useable active strain remaining available in the composite structure 3 must not be substantially reduced, and the degree of compression in the piezoceramic element 1 must be sufficient to ensure that the piezoceramic element 1 is not placed under tension as a result of the expected maximum tensile loads that will be applied to the overall composite structure 3 in its final application.

In order to achieve the above goals or balance between the tension and compression, a corresponding optimization of the composite structure and especially the fiber composite panels 2 must be carried out. The following discussion develops and sets forth appropriate dimensional rules for fabricating the composite structure 3 according to the invention, with a preferred balance of the above discussed factors. Throughout this discussion, the following symbols and references will be used.

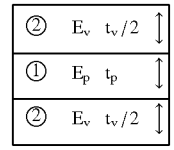

| Composite Structure ③ |
|---|
| ② $E_v$  $t_v/2$ ↕ |
| ① $E_p$  $t_p$ ↕ |
| ② $E_v$  $t_v/2$ ↕ |

| | |
|---|---|
| 1 | piezoceramic element |
| 2 | pre-stressing element (fiber composite panel) |
| $E_p$ | modulus of elasticity of the piezoceramic element ① |
| $t_p$ | thickness of the piezoceramic element ① |
| $E_v$ | modulus of elasticity of the pre-stressing element ② |
| $t_v$ | total thickness of all layers of the pre-stressing elements ② |
| $\epsilon_e$ | elastic compressive pre-stress of the piezoceramic element ② |
| $\epsilon_v$ | pre-strain of the pre-stressing elements ② (before adhesive bonding) |
| $V = \epsilon_v/\epsilon_e$ | pre-stressing ratio |
| $S = \dfrac{E_v \cdot t_v}{E_p \cdot t_p}$ | stiffness ratio |
| $\epsilon_p$ | active strain of the piezoceramic element by itself ① |
| $\epsilon_a$ | active strain of the overall composite structure ③ |
| $\eta_\epsilon = \epsilon_a/\epsilon_p$ | coefficient of active strain of the composite |

-continued

Composite Structure ③

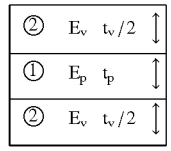

| | structure ③ |
|---|---|
| $\eta = \dfrac{F}{b}$ | force flux |
| b | width of the composite structure ③ |

1. Elastic Pre-Stressing of the Piezoelectric Element

*before adhesive bonding $n_v/2 \leftarrow \boxed{② \quad E_v, \ t_v/2} \rightarrow n_v/2 \quad \epsilon_2^* = \epsilon_v$ $\boxed{① \quad E_p, \ t_p} \quad \epsilon_1^* = 0$ $n_v/2 \leftarrow \boxed{② \quad E_v, \ t_v/2} \rightarrow n_v/2 \quad \epsilon_2^* = \epsilon_v$ after adhesive bonding $n_e/2 \leftarrow \boxed{② \quad E_v, \ t_v/2} \rightarrow n_e/2 \quad \epsilon_2 = \epsilon_v - \epsilon_e$ $-n_e \rightarrow \boxed{① \quad E_p, \ t_p} \leftarrow -n_e \quad \epsilon_1 = -\epsilon_e$ $n_e/2 \leftarrow \boxed{② \quad E_v, \ t_v/2} \rightarrow n_e/2 \quad \epsilon_2 = \epsilon_v - \epsilon_e$ -continued $$\left. \begin{array}{l} \epsilon_2 = \epsilon_v - \epsilon_e \\ \epsilon_1 = -\epsilon e \end{array} \right\} \epsilon_2 - \epsilon_1 = \epsilon_v \qquad \text{Equation (1)}$$

$$\epsilon_1 = \dfrac{-n_e}{E_p \cdot t_p} = -\epsilon_e \qquad \text{Equation (2)}$$

$$\epsilon_2 = \dfrac{n_e/2}{E_v \cdot t_v/2} = \dfrac{n_e}{E_v \cdot t_v} \qquad \text{Equation (3)}$$

$$\epsilon_2^* = \epsilon_v = \dfrac{n_v}{E_v \cdot t_v} \qquad \text{Equation (4)}$$

By substituting Equations (2), (3) and (4) into (1):

$$\dfrac{n_e}{E_v \cdot t_v} + \dfrac{n_e}{E_p \cdot t_p} = \dfrac{n_v}{E_v \cdot t_v} \qquad \text{Equation (5)}$$

$$\dfrac{n_e}{E_p \cdot t_p} \left( \dfrac{E_p \cdot t_p}{E_v \cdot t_v} + 1 \right) = \epsilon_v$$

$$\epsilon_e = \dfrac{\epsilon_v}{\dfrac{E_p \cdot t_p}{E_v \cdot t_v} + 1}$$

2. Active Strain of the Composite Structure

The active strain of the composite structure can be calculated in a manner analogous to the calculations carried out above in section 1 for the elastic pre-stressing of the piezoelectric element. In the present case of active straining of the composite structure, the calculations are simply modified in the sense that the piezoceramic element is the material that is pre-stressed and pre-strained due to the piezoelectric effect, whereby the straining of the piezoceramic element in turn deforms the layers of the fiber composite panels.

$$\epsilon_a = \dfrac{\epsilon_p}{\dfrac{E_v \cdot t_v}{E_p \cdot t_p} + 1} \qquad \text{Equation (6)}$$

3. Interpretation and Evaluation

Above Equation (6) provides the basis for calculating a coefficient that defines what portion of the active strain of the piezoelectric material can be transferred or transmitted through the composite structure.

$$\eta_\epsilon = \dfrac{\epsilon_a}{\epsilon_p} = \dfrac{1}{\dfrac{E_v \cdot t_v}{E_p \cdot t_p} + 1} = \dfrac{1}{S + 1} \qquad \text{Equation (7)}$$

Then, the desired coefficient defines or specifies the required stiffness ratio S between the pre-stressed fiber composite panels and the active piezoceramic element, that must be achieved and maintained. Next, taking into account the compressive pre-stressing $\epsilon_e$ of the piezoceramic element necessary in view of the expected externally applied tension loading, it is possible to determine the corresponding required pre-strain $\epsilon_v$ of the fiber composite panels using the above Equation (5), as follows.

$$\dfrac{\epsilon_v}{\epsilon_e} = V = \dfrac{E_p \cdot t_p}{E_v \cdot t_v} + 1 = \dfrac{1}{S} + 1 = 1 + \dfrac{\eta_\epsilon}{1 - \eta_\epsilon} \qquad \text{Equation (8)}$$

Figure 4:
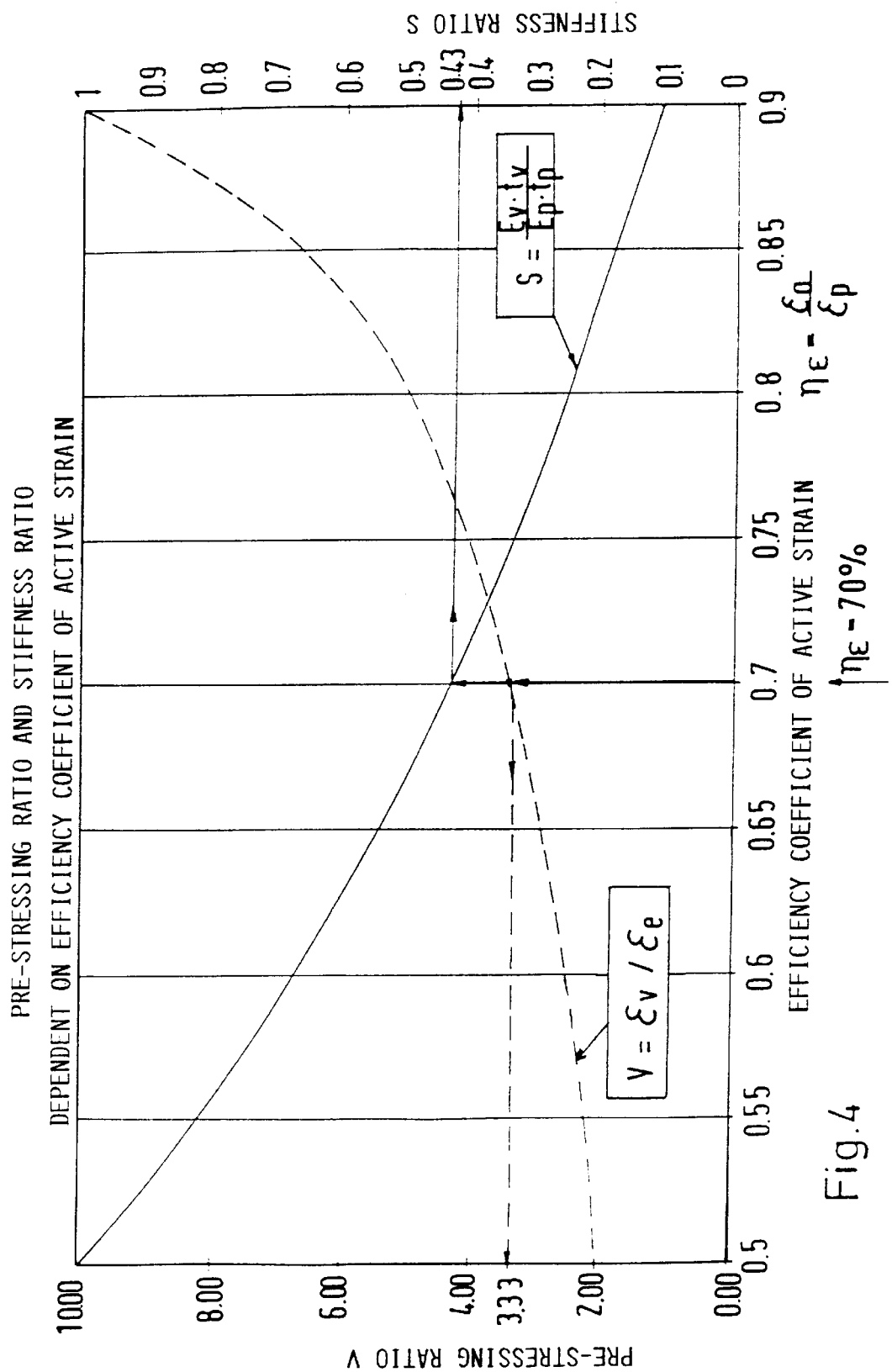
FIG. 4 is a graph representing the pre-stressing ratio V and the stiffness ratio S as respective functions dependent on the coefficient of active strain.

FIG. 4 shows the interrelationships of the pre-stressing ratio V and the stiffness ratio S as respective functions dependent on the coefficient of active strain $\eta_\epsilon$. Namely, the pre-stressing ratio V is plotted along the left ordinate of the graph of FIG. 4, the stiffness ratio S is plotted along the right ordinate of the graph of FIG. 4, and the coefficient of active strain is plotted along the abscissa. For any desired coefficient of active strain, the required stiffness ratio S and pre-stressing ratio V can be determined from the graph. For example, for a desired coefficient $\eta_\epsilon$=70%, it is necessary to use a stiffness ratio S=0.43 and a pre-stressing ratio V=3.33, as shown by the example in FIG. 4. Namely, for the present example, the pre-stressed fiber composite panels must possess 43% of the stiffness of the piezoceramic element, and must be pre-stressed to achieve a pre-strain of 3.33 times the desired compressive pre-stress of the piezoceramic element.

Along the lines of the above example, the graph of FIG. 4 can be used to determine the required stiffness ratio S and pre-stressing ratio V for any given application. It is simply necessary to know the physical properties, such as the compressive strength, tensile strength, and strain characteristics of the piezoceramic element and of the fiber composite panel, and to know the range of loads that are expected to arise in practice during operation. Based on these factors, the desired or required compressive pre-stress of the piezoceramic material can be determined, in order to ensure that the tensile loads resulting in operation do not exceed the compressive pre-stress, either at all or by a certain margin in which the piezoceramic element may be subjected to tension without failing.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The term "substantially perpendicular" used herein refers to exactly perpendicular arrangements as well as slight deviations from a nominally perpendicular arrangement that may typically arise during fabrication techniques in the present field.

What is claimed is:

1. A method of producing a composite structure including a plate-shaped piezoelectric element sandwiched and adhesively bonded between two fiber composite panels, said method comprising the following steps:

a) applying at least one tensile pre-stressing force to each of said fiber composite panels respectively in a plane of each of said fiber composite panels so as to elongate each of said fiber composite panels in said plane, wherein said at least one pre-stressing force is applied to and is effective along a force direction lying in said plane;

b) while continuing and maintaining said applying of said at least one pre-stressing force, adhesively bonding said fiber composite panels respectively onto opposite surfaces of said piezoelectric element; and c) after said adhesive bonding has securely bonded said fiber composite panels onto said piezoelectric element, discontinuing said applying of said at least one pre-stressing force, so that said fiber composite panels respectively relax in a direction opposite said force direction in said plane and thereby an internal stress is induced in said piezoelectric element.

2. The method according to claim 1, further comprising installing said composite structure as a component in an actuator for actuating a rotor of a helicopter.

3. The method according to claim 1, wherein said piezoelectric element is a piezoceramic element, and said step of adhesive bonding comprises applying an adhesive on an entire contact interface between said piezoceramic element and each said fiber composite panel.

4. The method according to claim 1, wherein said step a) comprises applying only a single said pre-stressing force to each said fiber composite panel along a single force axis.

5. The method according to claim 1, wherein said step a) comprises applying two pre-stressing forces included in said at least one pre-stressing force, to each of said fiber composite panels, respectively along two substantially perpendicular force axes.

6. The method according to claim 1, wherein said at least one pre-stressing force applied to each said fiber composite panel in said step a) causes a pre-straining of each said fiber composite panel before said step b), and said step b) further comprises maintaining said pre-straining.

7. The method according to claim 1, wherein said adhesive bonding in said step b) comprises applying a pressing force substantially perpendicularly onto outer major surfaces of said fiber composite panels.

8. The method according to claim 1, wherein said applying of said at least one pre-stressing force comprises applying at least one external mechanical tension force to each said fiber composite panel.

9. The method according to claim 8, wherein said applying of at least one mechanical tension force comprises engaging opposite edges of each said fiber composite panel in a tension applying machine and then applying said mechanical tension force using said tension applying machine.

10. The method according to claim 1, wherein said step a) further comprises selecting and controlling a magnitude of said at least one pre-stressing force.

11. The method according to claim 10, wherein said step a) further a comprises selecting and controlling a direction of application of said at least one pre-stressing force.

12. The method according to claim 10, wherein said magnitude of said at least one pre-stressing force is selected and controlled so that after said step c), each said fiber composite panel is under an internal tension and said internal stress in said piezoelectric element is an internal compression.

13. The method according to claim 12, wherein said magnitude of said at least one pre-stressing force is selected and controlled so that said internal compression in said piezoelectric element is greater in magnitude than a tension force that will be effective on said piezoelectric element in a final installed arrangement of said composite structure, such that said piezoelectric element will always remain under internal compression.

14. The method according to claim 12, wherein said magnitude of said at least one pre-stressing force is selected and controlled so that a residual strain remaining in said fiber composite panels after said step c) is minimized.

15. The method according to claim 12, wherein said fiber composite panels have a certain panel stiffness $S_v = E_v \cdot t_v$, and said piezoelectric element has a certain element stiffness $S_p = E_p \cdot t_p$, wherein $E_v$ is the modulus of elasticity of said panels, $t_v$ is the total thickness of said panels, $E_p$ is the modulus of elasticity of said piezoelectric element, $t_p$ is the thickness of said piezoelectric element, and a stiffness ratio $S$ is defined as $S = S_v/S_p$, and wherein said magnitude of said pre-stressing force is selected and controlled such that said internal compression in said piezoelectric element does not exceed a compressive strength limit of said piezoelectric element and such that a pre-stressing ratio $V$ defined as $V = \epsilon_v/\epsilon_e$ wherein $\epsilon_v$ is said pre-stressing force and $\epsilon_e$ is said internal compression will satisfy the relationship $V = (1+S)/S$.

16. The method according to claim 12, wherein said fiber composite panels have a total cumulative thickness $t_v$ and a modulus of elasticity $E_v$, and said piezoelectric element has a thickness $t_p$ and a modulus of elasticity $E_p$, wherein a stiffness ratio $S$ is defined as $S = (E_v \cdot t_v)/(E_p \cdot t_p)$, and wherein said step of selecting and controlling said pre-stressing force comprises selecting a desired magnitude $\epsilon_e$ of said internal compression of said piezoelectric element and then selecting and controlling said applied pre-stressing force to have said magnitude of said pre-stressing force defined by $\epsilon_v = \epsilon_e(1/S + 1)$.

17. The method according to claim 12, wherein said step of selecting and controlling said pre-stressing force comprises:

selecting a desired magnitude $\epsilon_e$ of said internal compression in said piezoelectric element, selecting a desired coefficient of active strain $\eta_\epsilon$ defined as $\eta_\epsilon = \epsilon_a/\epsilon_p$, wherein $\epsilon_a$ is the active strain of said composite structure during actuation of said piezoelectric element and $\epsilon_p$ is the active strain of said piezoelectric element during actuation thereof by itself not arranged in said composite structure, determining a required magnitude $\epsilon_v$ of said pre-stressing force according to $$\epsilon_v = \epsilon_e\left(1 + \frac{\eta_\epsilon}{1-\eta_\epsilon}\right)$$

and selecting and controlling said magnitude of said applied pre-stressing force to be said required magnitude $\epsilon_v$.

18. The method according to claim 17, further comprising selecting at least one of a material for said fiber composite panels, a thickness dimension for said fiber composite panels, a material for said piezoelectric element, and a thickness dimension for said piezoelectric element, such that a stiffness ratio S defined as:

$$S = \frac{E_v \cdot t_v}{E_p \cdot t_p}$$

wherein $E_v$ is the modulus of elasticity of said material for said fiber composite panels, $t_v$ is a total of said thickness dimension of all layers of said fiber composite panels, $E_p$ is the modulus of elasticity of said material for said piezoelectric element, $t_p$ is said thickness dimension of said piezoelectric element, satisfies the equation $S=1/\eta_\epsilon-1$.

19. The method according to claim 1, wherein said at least one tension force comprises two tensile pre-stressing forces, and said applying in said step a) comprises applying said two tension forces to each said fiber composite panel respectively along two substantially perpendicular force axes lying in said plane of each said fiber composite panel.

20. The method according to claim 1, wherein said continuing and maintaining said applying of said at least one pre-stressing force in said step b) comprises holding said pre-stressing force constant during said step b).

21. The method according to claim 1, wherein said step b) further comprises maintaining said piezoelectric element in a neutral unstressed condition during said step b), and wherein said discontinuing said applying of said at least one pre-stressing force in said step c) causes each said fiber composite panel to impose said internal stress onto said piezoelectric element as a reaction stress.

22. The method according to claim 6, wherein said continuing and maintaining said applying of said at least one pre-stressing force and said maintaining of said pre-straining in said step b) comprises holding said pre-straining of each said fiber composite panel constant during said step b).

23. The method according to claim 1, wherein said composite structure has a flat planar configuration, with said piezoelectric element and said fiber composite panels each extending respectively flat and parallel to said plane.

24. A method of producing a composite structure including a plate-shaped piezoelectric element sandwiched and adhesively bonded between two fiber composite panels, said method comprising the following steps:

a) straining and thereby elongating each of said fiber composite panels into an elongated condition in at least one strain direction respectively in a flat plane of each of said fiber composite panels;

b) while holding said fiber composite panels in said elongated condition, adhesively bonding said fiber composite panels respectively onto opposite surfaces of said piezoelectric element; and c) after said step b), discontinuing said holding of said fiber composite panels in said elongated condition and allowing said fiber composite panels to relax opposite said straining in said at least one strain direction, thereby imposing an internal compression stress in said piezoelectric element.

25. The method according to claim 24, wherein said step b) further comprises maintaining said piezoelectric element in a neutral unstressed condition during said step b).

26. The method according to claim 24, wherein said steps a), b) and c) are carried out such that said fiber composite panels have a residual internal tension stress upon completion of said step c).

27. The method according to claim 24, wherein said composite structure has a flat planar configuration, with said piezoelectric element and said fiber composite panels each extending respectively flat and parallel to said plane.

* * * * *

UNITED STATES PATENT AND TRADEMARK OFFICE
CERTIFICATE OF CORRECTION

PATENT NO. : 6,162,313
DATED : December 19, 2000
INVENTOR(S) : Horst Bansemir et al.

It is certified that error appears in the above-identified patent and that said Letters Patent is hereby corrected as shown below:

Column 9,
Line 33, after "one", replace "tension" by -- tensile pre-stressing --;
After "two", replace "tensile prestressing" by -- tension --.

Signed and Sealed this

Ninth Day of October, 2001

Attest:

NICHOLAS P. GODICI
Attesting Officer   Acting Director of the United States Patent and Trademark Office